United States Patent
Chang et al.

(10) Patent No.: US 11,495,572 B2
(45) Date of Patent: Nov. 8, 2022

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Yung-Shun Chang, Kaohsiung (TW); Teck-Chong Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/932,693

(22) Filed: Jul. 17, 2020

(65) Prior Publication Data

US 2020/0350282 A1    Nov. 5, 2020

Related U.S. Application Data

(63) Continuation of application No. 16/158,294, filed on Oct. 11, 2018, now Pat. No. 10,741,523.

(51) Int. Cl.
*H01L 23/00* (2006.01)
*H01L 21/56* (2006.01)

(52) U.S. Cl.
CPC ............ *H01L 24/97* (2013.01); *H01L 21/561* (2013.01); *H01L 24/33* (2013.01); *H01L 2224/02373* (2013.01); *H01L 2224/0401* (2013.01)

(58) Field of Classification Search
CPC ....... H01L 24/97; H01L 21/561; H01L 24/33; H01L 2224/02373; H01L 2224/0401;
(Continued)

(56) References Cited

U.S. PATENT DOCUMENTS

| | | | | | |
|---|---|---|---|---|---|
| 2007/0195404 | A1* | 8/2007 | Iijima | ................. | C09B 67/0033 359/359 |
| 2010/0019387 | A1* | 1/2010 | Miura | ................... | H01L 23/481 257/773 |

(Continued)

FOREIGN PATENT DOCUMENTS

| CN | 108074894 A | 5/2018 |
|---|---|---|
| TW | I446507 B | 7/2014 |

OTHER PUBLICATIONS

Non-Final Office Action for U.S. Appl. No. 16/158,294, dated Dec. 10, 2019, 8 pages.

(Continued)

*Primary Examiner* — Victor A Mandala
(74) *Attorney, Agent, or Firm* — Foley & Lardner LLP

(57) ABSTRACT

A semiconductor package device includes a transparent carrier, a first patterned conductive layer, a second patterned conductive layer, and a first insulation layer. The transparent carrier has a first surface, a second surface opposite to the first surface and a third surface extended between the first surface and the second surface. The first patterned conductive layer is disposed on the first surface of the transparent carrier. The first patterned conductive layer has a first surface coplanar with the third surface of the transparent carrier. The second patterned conductive layer is disposed on the first surface of the transparent carrier and electrically isolated from the first patterned conductive layer. The first insulation layer is disposed on the transparent carrier and covers the first patterned conductive layer.

19 Claims, 24 Drawing Sheets

(58) Field of Classification Search
CPC . H01L 21/481; H01L 23/15; H01L 23/49894; H01L 21/4846; H01L 23/49838
See application file for complete search history.

(56) References Cited

U.S. PATENT DOCUMENTS

| | | | |
|---|---|---|---|
| 2011/0294237 A1 | 12/2011 | Chang | |
| 2011/0298000 A1* | 12/2011 | Liu | H01L 23/481 257/E33.059 |
| 2012/0161308 A1* | 6/2012 | Chu | H01L 23/3114 257/E31.124 |
| 2013/0056748 A1* | 3/2013 | Matsui | H01L 33/60 257/E33.025 |
| 2013/0277700 A1* | 10/2013 | Matsumura | H01L 33/50 257/98 |
| 2014/0247475 A1* | 9/2014 | Parker | B32B 17/10055 359/275 |
| 2015/0287762 A1* | 10/2015 | Chae | H01L 33/38 362/97.1 |
| 2016/0090299 A1* | 3/2016 | Sasagawa | B81C 1/00801 438/653 |
| 2017/0263543 A1 | 9/2017 | Bang et al. | |
| 2017/0373046 A1* | 12/2017 | Gardner | H01L 21/6835 |
| 2018/0138262 A1 | 5/2018 | Chen et al. | |
| 2018/0261398 A1* | 9/2018 | Ichinose | H01G 9/209 |
| 2019/0006404 A1* | 1/2019 | Wang | H01L 27/146 |

OTHER PUBLICATIONS

Notice of Allowance for U.S. Appl. No. 16/158,294, dated Apr. 2, 2020, 8 pages.
Office Action for corresponding Taiwan Patent Application No. 108103692, issued on Aug. 4, 2020, 3 pages.
Search Report (with English translation) for corresponding Taiwan Patent Application No. 108103692, issued on Aug. 4, 2020, 2 pages.

* cited by examiner

SEMICONDUCTOR PACKAGE DEVICE AND METHOD OF MANUFACTURING THE SAME

CROSS-REFERENCE TO RELATED APPLICATION

This application is a continuation of U.S. patent application Ser. No. 16/158,294 filed Oct. 11, 2018, the contents of which is incorporated herein by reference in its entirety.

BACKGROUND

1. Technical Field

The subject application relates generally to a semiconductor package device, and to a semiconductor package device including a transparent carrier.

2. Description of the Related Art

A singulation operation, which may include grinding techniques, optical techniques (e.g. laser cutting techniques), mechanical techniques (e.g. knife/blade cutting), chemical techniques (e.g. etching techniques), can be performed on a wafer or panel to manufacture a semiconductor package device. Controlling singulation operations to avoid damage (e.g. cracking, chipping, or other issues) on the wafer or panel or the semiconductor package device can be challenging. It can be challenging, when an optical technique is used, to manufacture a semiconductor package device having transparent materials.

SUMMARY

In one aspect, according to some embodiments, a semiconductor package device includes a transparent carrier, a first patterned conductive layer, a second patterned conductive layer, and a first insulation layer. The transparent carrier has a first surface, a second surface opposite to the first surface and a third surface extended between the first surface and the second surface. The first patterned conductive layer is disposed on the first surface of the transparent carrier. The first patterned conductive layer has a first surface coplanar with the third surface of the transparent carrier. The second patterned conductive layer is disposed on the first surface of the transparent carrier and electrically isolated from the first patterned conductive layer. The first insulation layer is disposed on the transparent carrier and covers the first patterned conductive layer.

In another aspect, according to some embodiments, a semiconductor package device includes a transparent carrier, a first patterned conductive layer, and a first transparent insulation layer. The transparent carrier has a first surface, a second surface opposite to the first surface and a third surface extended between the first surface and the second surface. The first patterned conductive layer is disposed on the first surface of the transparent carrier. The first patterned conductive layer has a first surface coplanar with the third surface of the transparent carrier. The first transparent insulation layer is disposed on the transparent carrier and covers the first patterned conductive layer.

In yet another aspect, according to some embodiments, a method of manufacturing a semiconductor package device includes forming a patterned conductive layer on a scribe line of a transparent carrier; forming a trench through the patterned conductive layer and into the transparent carrier by a dicing operation along the scribe line; grinding the transparent carrier at a second surface of the transparent carrier facing away from the patterned conductive layer to form a plurality of singulated transparent carrier units; attaching the plurality of singulated transparent carrier units to an adhesive layer; and singulating the adhesive layer by a laser operation. An alignment of the laser operation is based on the patterned conductive layer.

BRIEF DESCRIPTION OF THE DRAWINGS

Aspects of the subject application are readily understood from the following detailed description when read with the accompanying drawings. It is noted that various features may not be drawn to scale, and the dimensions of the depicted features in the drawings may be arbitrarily increased or reduced for clarity of discussion.

Common reference numerals are used throughout the drawings and the detailed description to indicate the same or similar elements.

DETAILED DESCRIPTION

When an optical technique (e.g., a laser technique) is used to singulate a semiconductor package structure having transparent material(s) (e.g., a transparent carrier and/or a transparent insulation layer), an alignment used in the optical technique may fail because scribe lines of the semiconductor package structure may not be correctly detected or recognized due to the transparent material(s).

In some embodiments of the subject application, an opaque or non-transparent material/layer is disposed on scribe lines of a glass carrier/panel/plate during manufacture of a semiconductor package device, and a portion of such an opaque or non-transparent material/layer remains in the vicinity of (or close to/adjacent to) a sidewall/edge of the semiconductor package device subsequent to a singulation/dicing/cutting/separation operation. The opaque or non-transparent material/layer may improve the alignment when an optical singulation technique is applied.

Figure 1A:
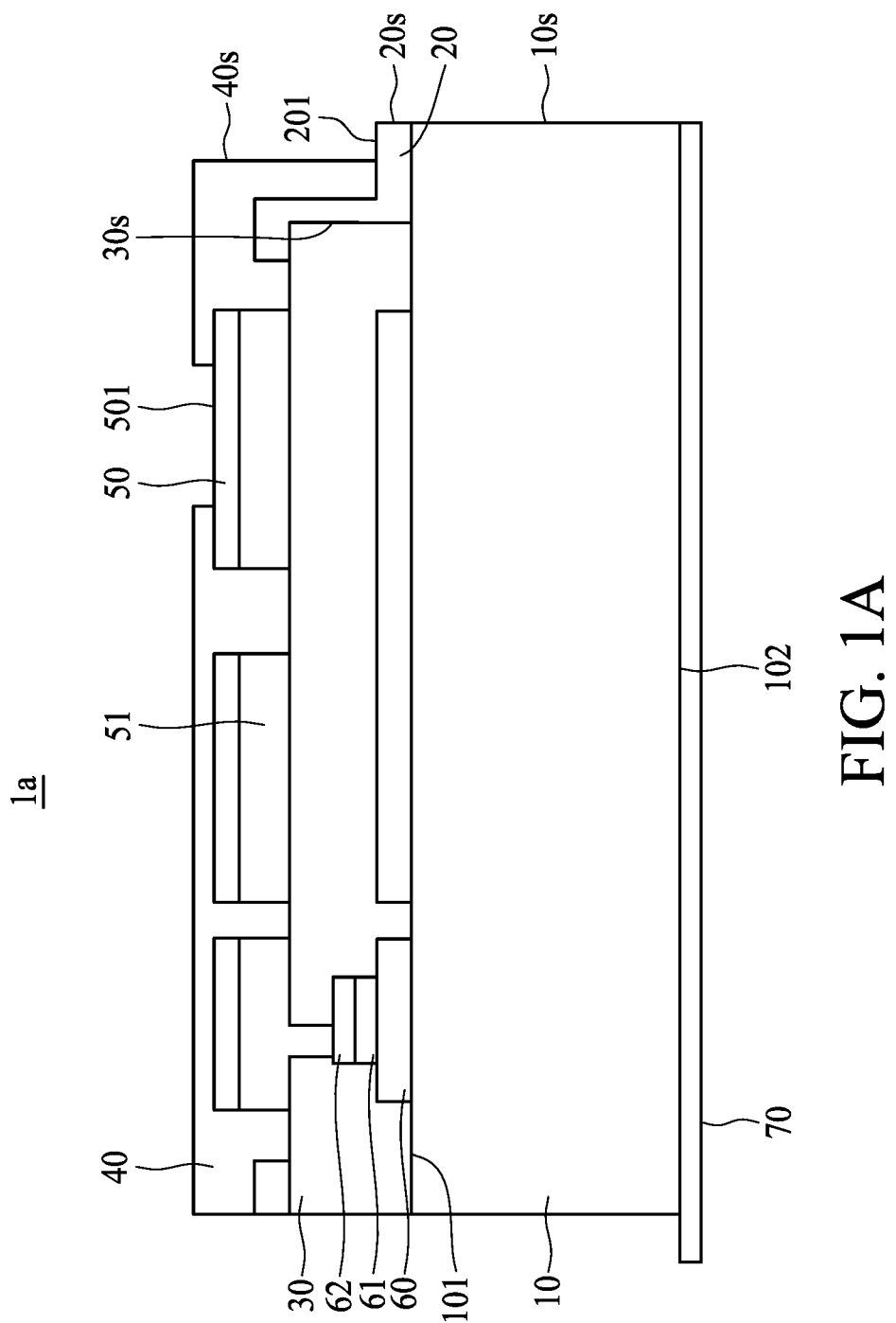
FIG. 1A illustrates a cross-sectional view of a semiconductor package device in accordance with some embodiments of the subject application.

FIG. 1A illustrates a cross-sectional view of a semiconductor package device 1a in accordance with some embodiments of the subject application. The semiconductor package device 1a includes a transparent carrier 10, patterned conductive layers 20, 50, 51 and 60, insulation layers 30, 40 and 61, a metal layer 62, and an adhesive material 70.

The transparent carrier 10 has a surface 101. The transparent carrier 10 has a surface 102 opposite the surface 101.

The transparent carrier 10 has a surface 10s (e.g. a side or lateral surface) extended between the surface 101 and the surface 102. The transparent carrier 10 may include glass or other transparent materials. The transparent carrier 10 may function as a substrate for the semiconductor package device 1a. The transparent carrier 10 may reduce electrical leakage or insertion loss for the semiconductor package device 1a.

The patterned conductive layer 60 is disposed on the surface 101 of the transparent carrier 10. The patterned conductive layer 60 is electrically isolated from the patterned conductive layer 20. In some embodiments of the subject application, the patterned conductive layer 60 may be part of an integrated passive device (IPD). In some embodiments of the subject application, the patterned conductive layer 60 may be part of a metal-insulation-metal (MIM) structure. For example, in the embodiment shown in FIG. 1A, the insulation layer 61, the metal layer 62, and the patterned conductive layer 60 may form an IPD or an MIM structure. The patterned conductive layer 60 may include gold (Au), silver (Ag), aluminum (Al), copper (Cu), or an alloy thereof.

The insulation layer 30 is disposed on the transparent carrier 10. The insulation layer 30 is disposed on at least a portion of the patterned conductive layer 60. The insulation layer 30 covers at least a portion of the patterned conductive layer 60. The insulation layer 30 may include transparent material. The insulation layer 30 may be transparent. The insulation layer 30 may include a passivation material. The insulation layer 30 may include a dielectric material.

A patterned conductive layer 51 is disposed on the insulation layer 30. The patterned conductive layer 51 may be electrically connected to the metal layer 62. The patterned conductive layer 51 may be a redistribution layer (RDL). The patterned conductive layer 51 may include gold (Au), silver (Ag), aluminum (Al), copper (Cu), or an alloy thereof. The patterned conductive layer 50 is disposed on the patterned conductive layer 51. The patterned conductive layer 50 is electrically isolated from the patterned conductive layer 20. The patterned conductive layer 50 and the patterned conductive layer 51 may constitute an under bump metallurgy (UBM) structure. The patterned conductive layer 50 may include gold (Au), silver (Ag), aluminum (Al), copper (Cu), or an alloy thereof.

The patterned conductive layer 20 is disposed on the surface 101 of the transparent carrier 10. The patterned conductive layer 20 has a surface 20s coplanar with the surface 10s of the transparent carrier 10. The patterned conductive layer 20 is disposed on the insulation layer 30. A sidewall 30s of the insulation layer 30 is covered by the patterned conductive layer 20. The patterned conductive layer 20 may have a "Z" shape (e.g. may include two portions that extend horizontally, that are offset from each other (e.g. do not vertically project on each other), and that are connected by a third vertical portion). The patterned conductive layer 20 may include opaque or non-transparent material. The patterned conductive layer 20 may be opaque or non-transparent. The patterned conductive layer 20 may include the same material as the patterned conductive layer 50. The patterned conductive layer 20 and the patterned conductive layer 50 may be formed concurrently, or may be integrally formed. In some embodiments of the subject application, the patterned conductive layer 20 is electrically isolated from other conductive elements/layers within the semiconductor package device 1a (e.g. from all other conductive elements/layers explicitly described herein).

The insulation layer 40 is disposed on the insulation layer 30. The insulation layer 40 is disposed on the patterned conductive layer 50. The insulation layer 40 is disposed on the patterned conductive layer 20. The insulation layer 40 covers at least a portion of the patterned conductive layer 20. A sidewall 40s of the insulation layer 40 is non-coplanar with the surface 20s of the patterned conductive layer 20. The patterned conductive layer 20 has a surface 201 connected to the surface 20s (e.g. substantially perpendicular to and connected to the surface 20s). The surface 201 of the patterned conductive layer 20 is exposed from the insulation layer 40. The insulation layer 40 covers the patterned conductive layer 51. The insulation layer 40 covers at least a portion of the patterned conductive layer 50. A surface 501 of the patterned conductive layer 50 is exposed from the insulation layer 40. The insulation layer 40 may include a transparent material. The insulation layer 40 may be transparent. The insulation layer 40 may include passivation material. The insulation layer 40 may include dielectric material.

The adhesive material 70 is disposed on the surface 102 of the transparent carrier 10. The adhesive material 70 may include a transparent material. The adhesive material 70 may include a die-attach-film (DAF). The adhesive material 70 may be used to attach the semiconductor package device 1a to another device or circuit board.

Figure 1B:
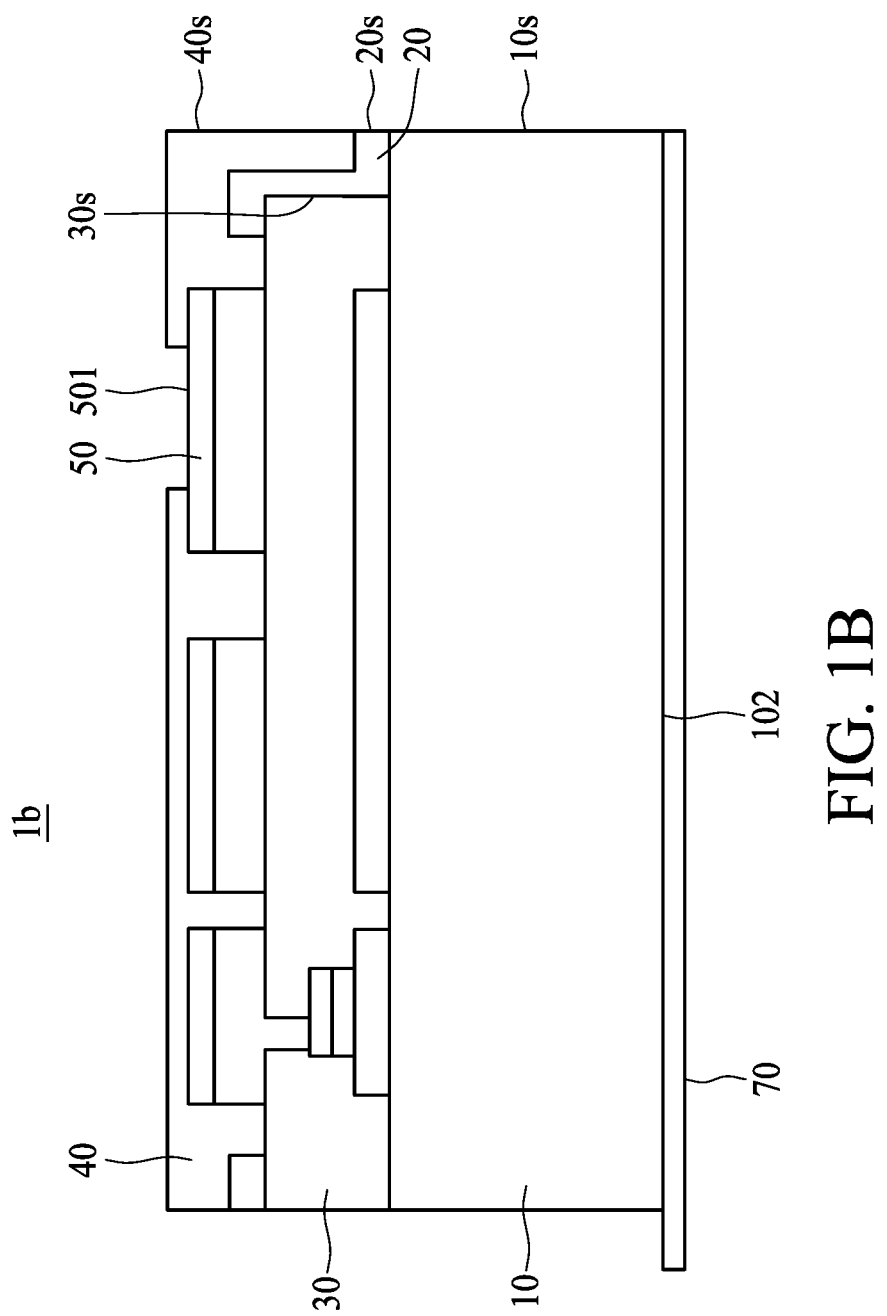
FIG. 1B illustrates a cross-sectional view of a semiconductor package device in accordance with some embodiments of the subject application.

FIG. 1B illustrates a cross-sectional view of a semiconductor package device 1b in accordance with some embodiments of the subject application. The semiconductor package device 1b is similar to the semiconductor package device 1a, but has at least the following differences.

The surface 40s of the insulation layer 40 is coplanar with the surface 20s of the patterned conductive layer 20 and the surface 10s of the transparent carrier 10. The exposed surface 201 of the patterned conductive layer 20 in the semiconductor package device 1a is covered by the insulation layer 40 in the semiconductor package device 1b.

Figure 2A:
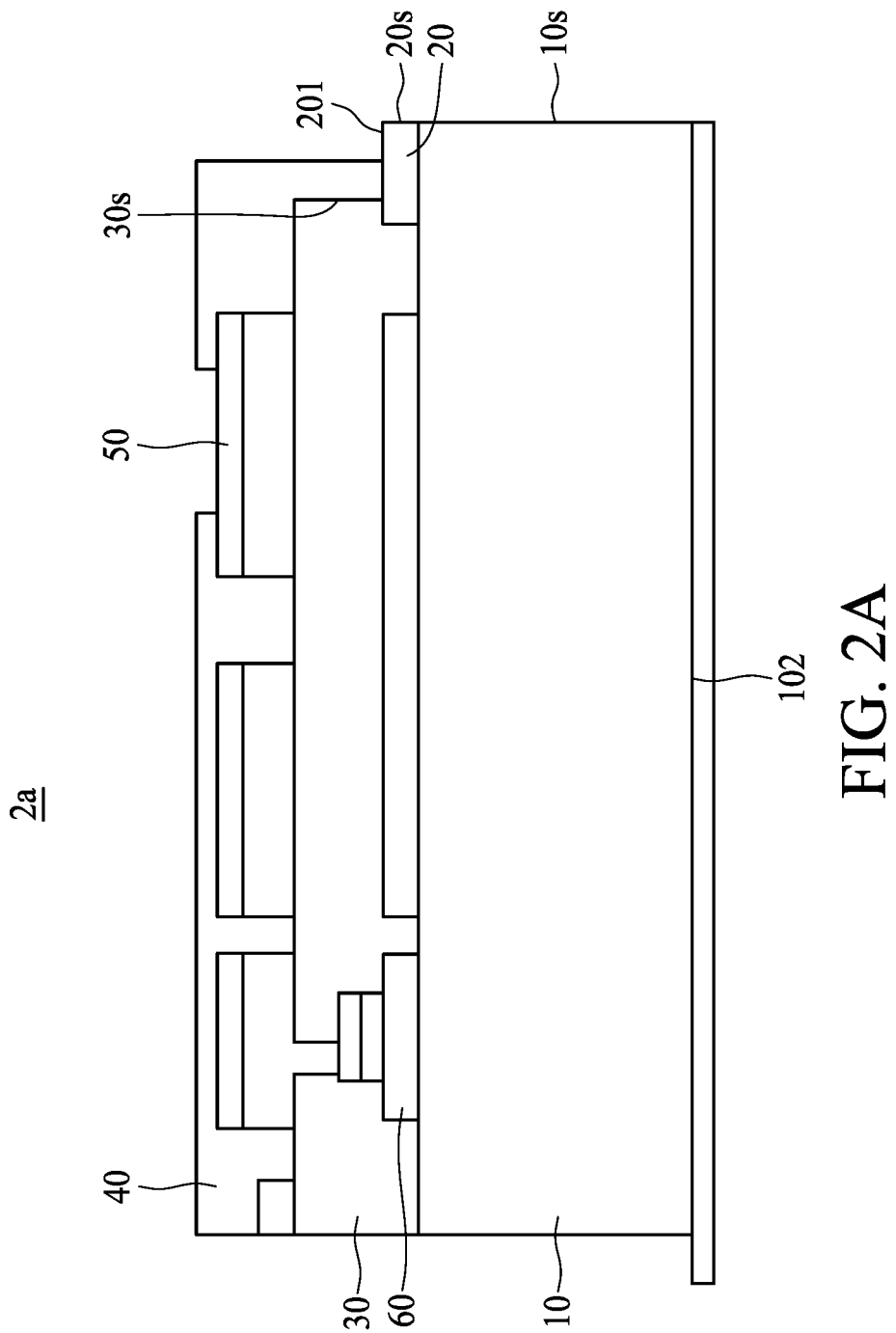
FIG. 2A illustrates a cross-sectional view of a semiconductor package device in accordance with some embodiments of the subject application.

FIG. 2A illustrates a cross-sectional view of a semiconductor package device 2a in accordance with some embodiments of the subject application. The semiconductor package device 2a is similar to the semiconductor package device 1a, but has at least the following differences.

The insulation layer 30 is disposed on the patterned conductive layer 20. The insulation layer 30 covers a portion of the patterned conductive layer 20. The sidewall 30s of the insulation layer 30 is covered by the insulation layer 40. The patterned conductive layer 20 is coplanar with the patterned conductive layer 60. The patterned conductive layer 20 and the patterned conductive layer 60 may include a same material. The patterned conductive layer 20 and the patterned conductive layer 60 may be formed concurrently, or may be integrally formed.

Figure 2B:
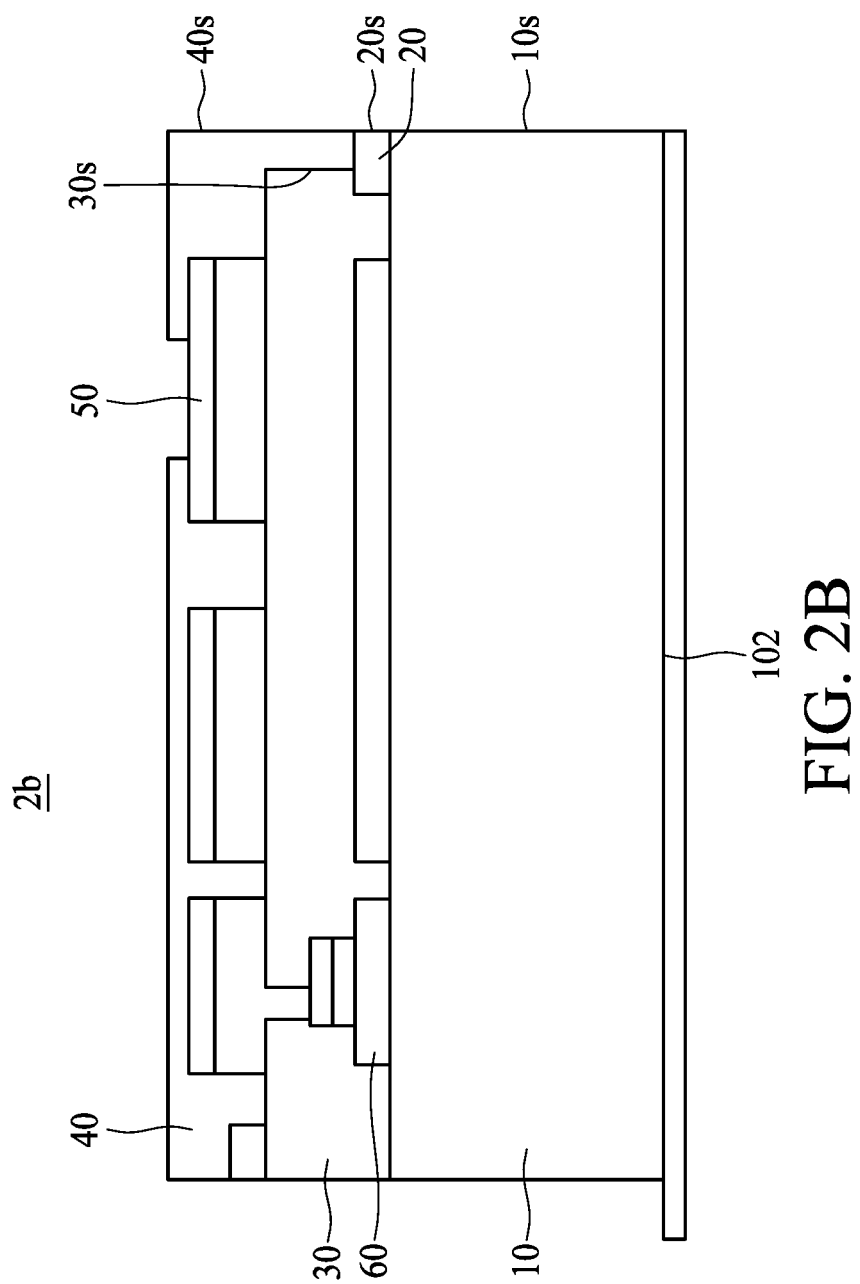
FIG. 2B illustrates a cross-sectional view of a semiconductor package device in accordance with some embodiments of the subject application.

FIG. 2B illustrates a cross-sectional view of a semiconductor package device 2b in accordance with some embodiments of the subject application. The semiconductor package device 2b is similar to the semiconductor package device 2a, but has at least the following differences.

The surface 40s of the insulation layer 40 is coplanar with the surface 20s of the patterned conductive layer 20 and the surface 10s of the transparent carrier 10. The exposed surface 201 of the patterned conductive layer 20 in the semiconductor package device 2a is covered by the insulation layer 40 in the semiconductor package device 2b.

FIG. 3A, FIG. 3B, FIG. 3C, FIG. 3D, FIG. 3E, FIG. 3F, FIG. 3G, FIG. 3H, FIG. 3I and FIG. 3J show operations for manufacturing a semiconductor package device 3j in accordance with some embodiments of the subject application.

Figure 3A:
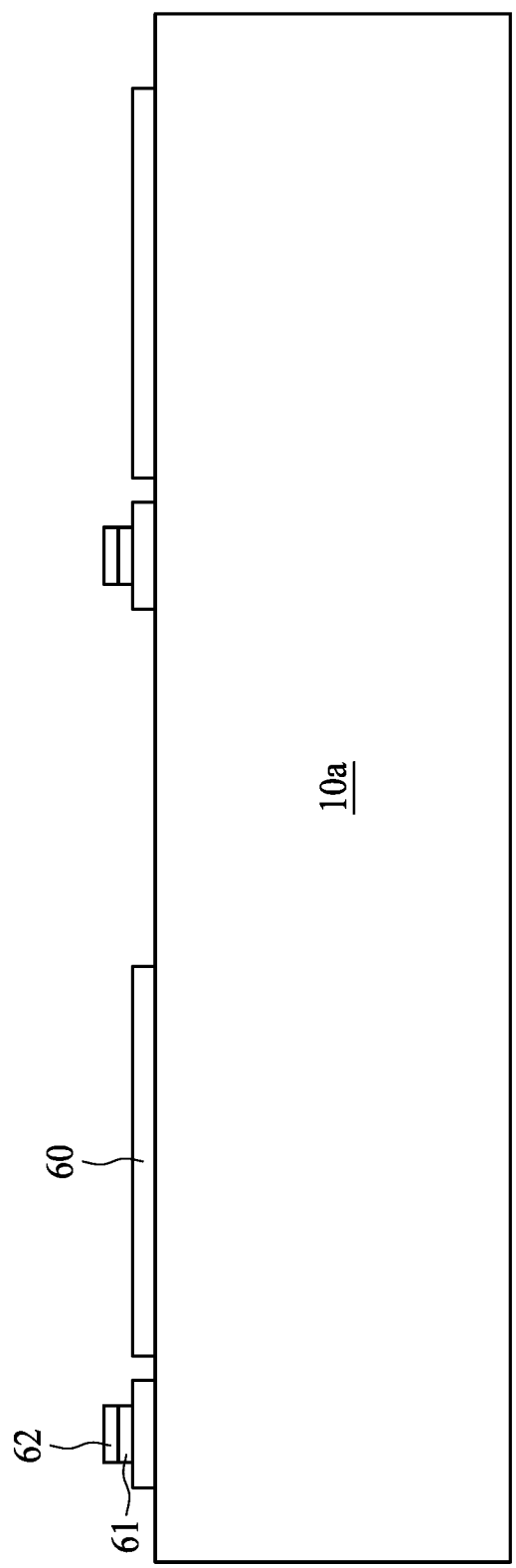
FIG. 3A, FIG. 3B, FIG. 3C, FIG. 3D, FIG. 3E, FIG. 3F, FIG. 3G, FIG. 3H, FIG. 3I and FIG. 3J show operations for manufacturing a semiconductor package device in accordance with some embodiments of the subject application.

Referring to FIG. 3A, a patterned conductive layer 60 is formed on a transparent carrier 10a. An insulation layer 61 is formed on the patterned conductive layer 60. A metal layer 62 is formed on the insulation layer 61. The patterned conductive layer 60, the insulation layer 61 and the metal layer 62 may form an IPD or an MIM structure. The patterned conductive layer 60 may be an electrode of an electronic component. The patterned conductive layer 60 may be formed by, for example, but not limited to, a plating operation.

Figure 3B:
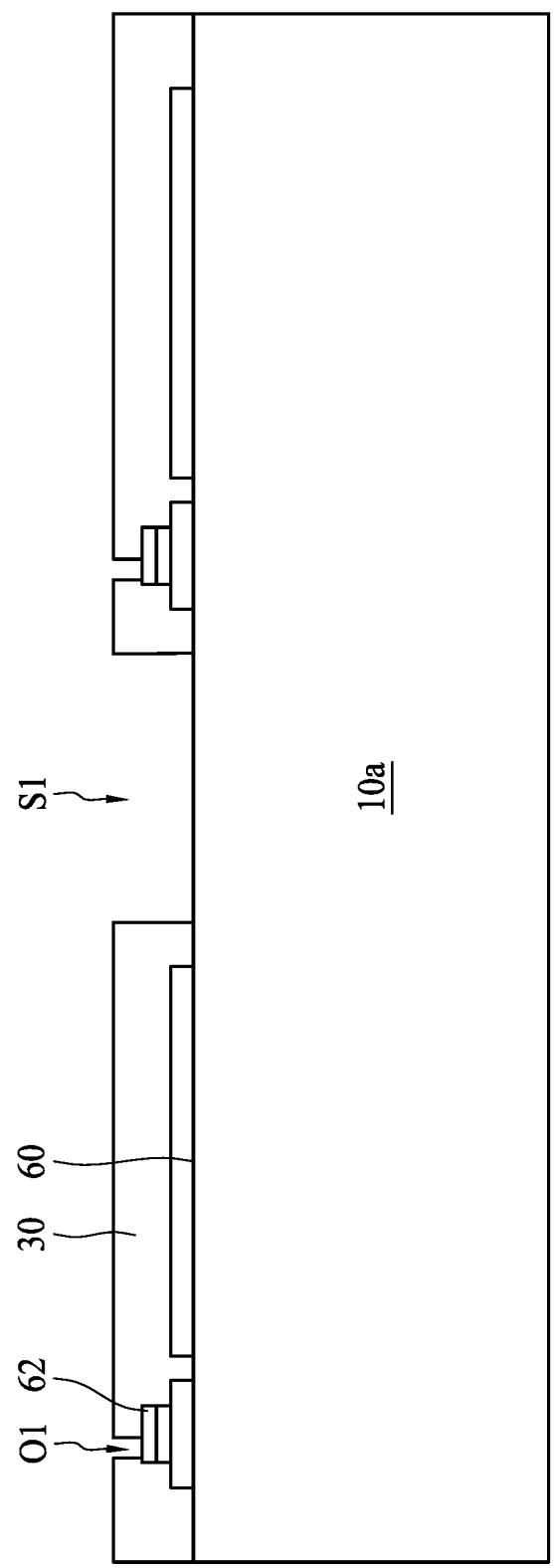

Referring to FIG. 3B, an insulation layer 30 is formed on the transparent carrier 10*a*. The insulation layer 30 is formed on the patterned conductive layer 60. The insulation layer 30 may be formed by, for example, but not limited to, a coating, a printing or a screening operation. An opening O1 is formed in the insulation layer 30 to expose the metal layer 62. A space S1 is formed in the insulation layer 30 to expose the transparent carrier 10*a*. The portion of the transparent carrier 10*a* exposed to the space S1 includes scribe lines for singulation. The opening O1 and the space S1 may be formed by, for example, but not limited to, an etching and/or a lithographic operation.

Figure 3C:
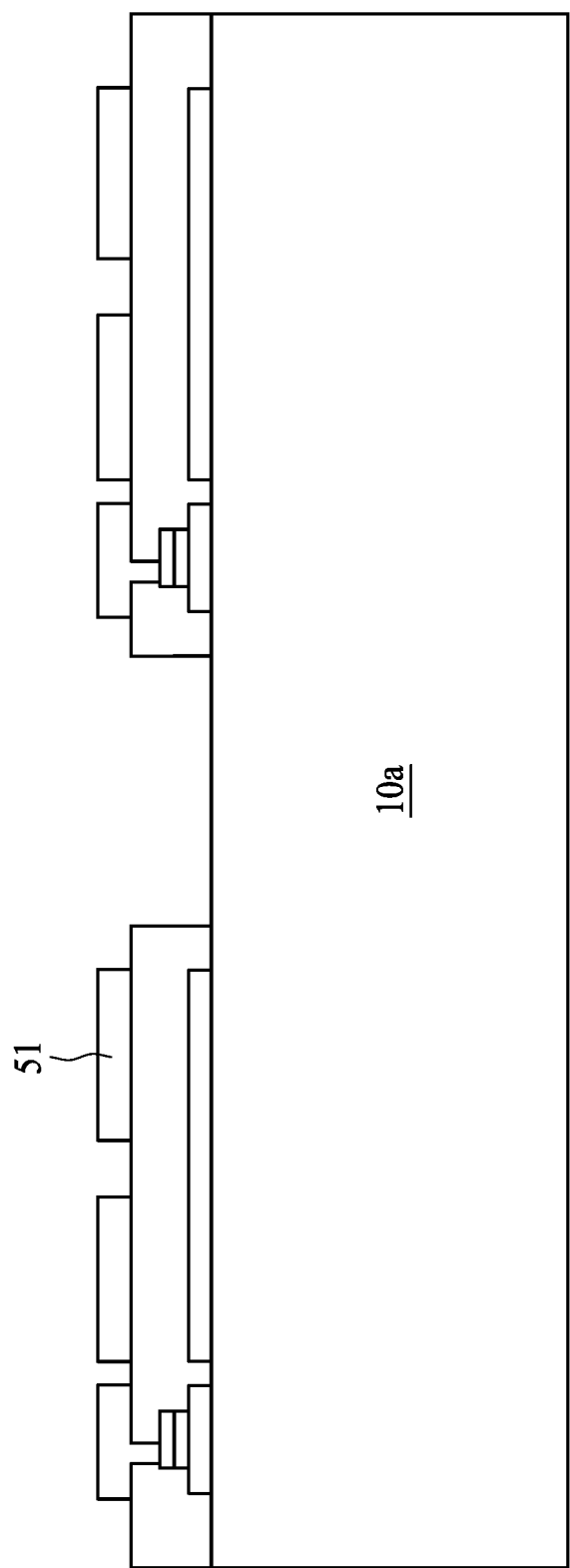

Referring to FIG. 3C, a patterned conductive layer 51 is formed on the insulation layer 30. The patterned conductive layer 51 may be formed by, for example, but not limited to, a plating operation. The patterned conductive layer 51 may include an RDL structure.

Figure 3D:
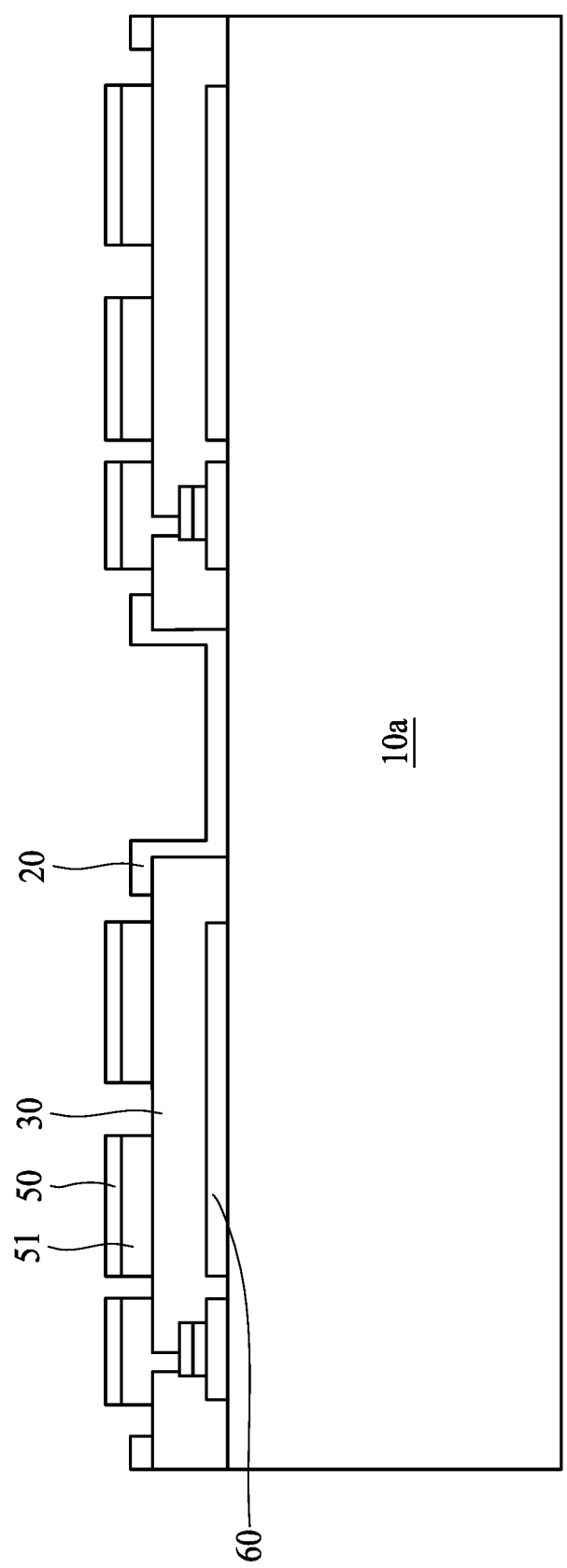

Referring to FIG. 3D, a patterned conductive layer 50 is formed on the patterned conductive layer 51. The patterned conductive layer 50 may be formed by, for example, but not limited to, a plating operation. The patterned conductive layer 50 and the patterned conductive layer 51 may form a UBM structure. A patterned conductive layer 20 is formed on the insulation layer 30. The patterned conductive layer 20 is formed on the transparent carrier 10*a*. The patterned conductive layer 20 is formed on the scribe lines of the transparent carrier 10*a*. The patterned conductive layer 20 and the patterned conductive layer 51 may be formed concurrently, or may be integrally formed. The patterned conductive layer 20 and the patterned conductive layer 51 may be formed by a same operation. The patterned conductive layer 20 may be electrically isolated from the patterned conductive layers 60, 51 and 50.

Figure 3E:
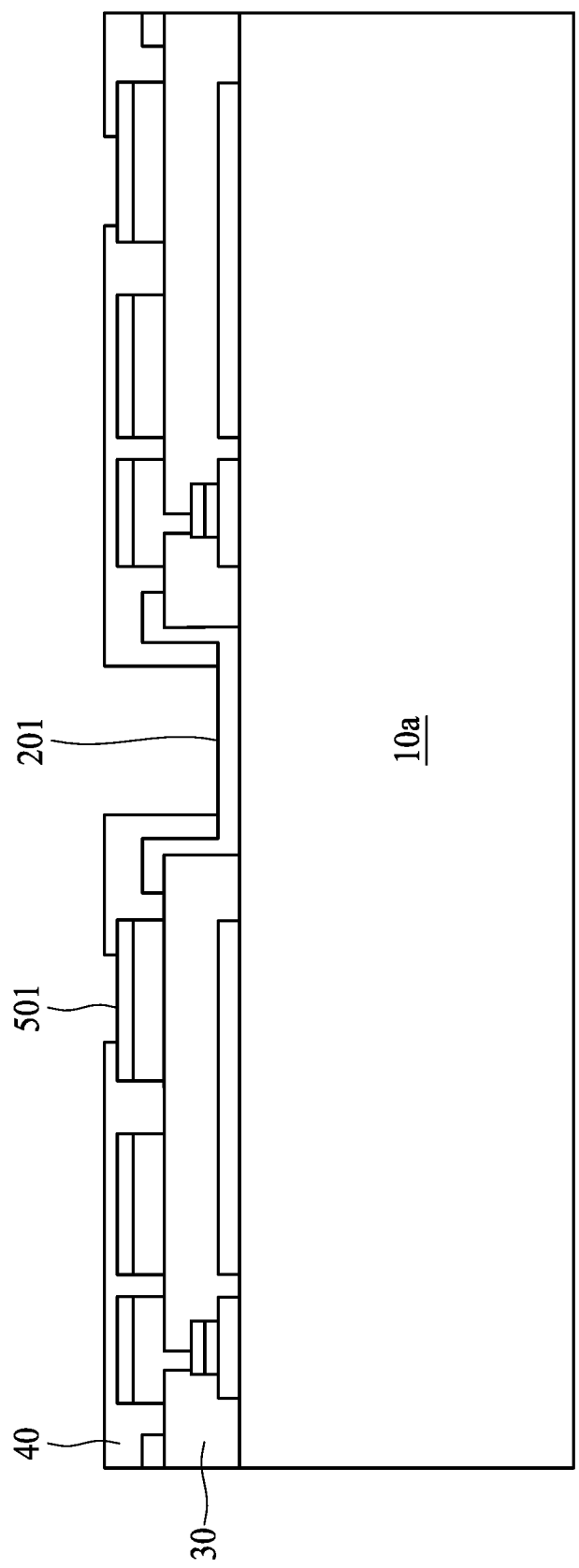

Referring to FIG. 3E, an insulation layer 40 is formed on the insulation layer 30. The insulation layer 40 covers the patterned conductive layer 20 and the patterned conductive layer 50. An etching operation is performed to expose a surface 501 of the patterned conductive layer 50 from the insulation layer 40. An etching operation is performed to expose a surface 201 of the patterned conductive layer 20 from the insulation layer 40.

Figure 3F:
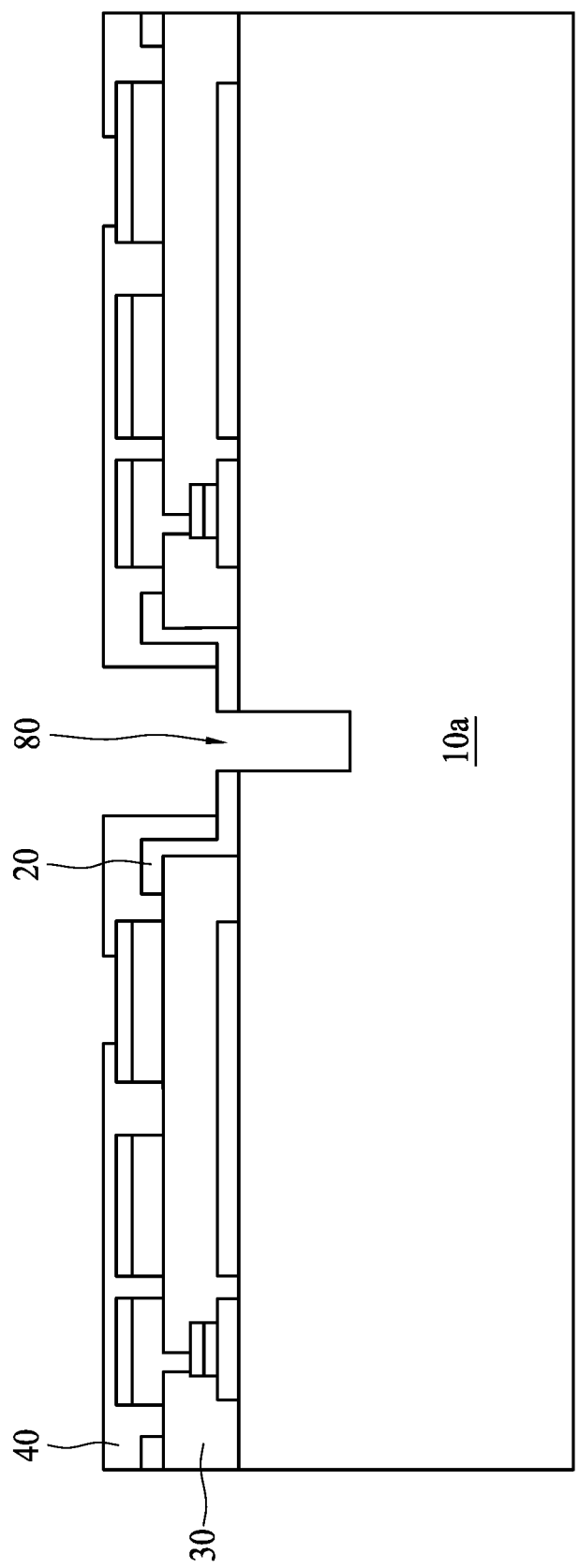
Figure 3G:
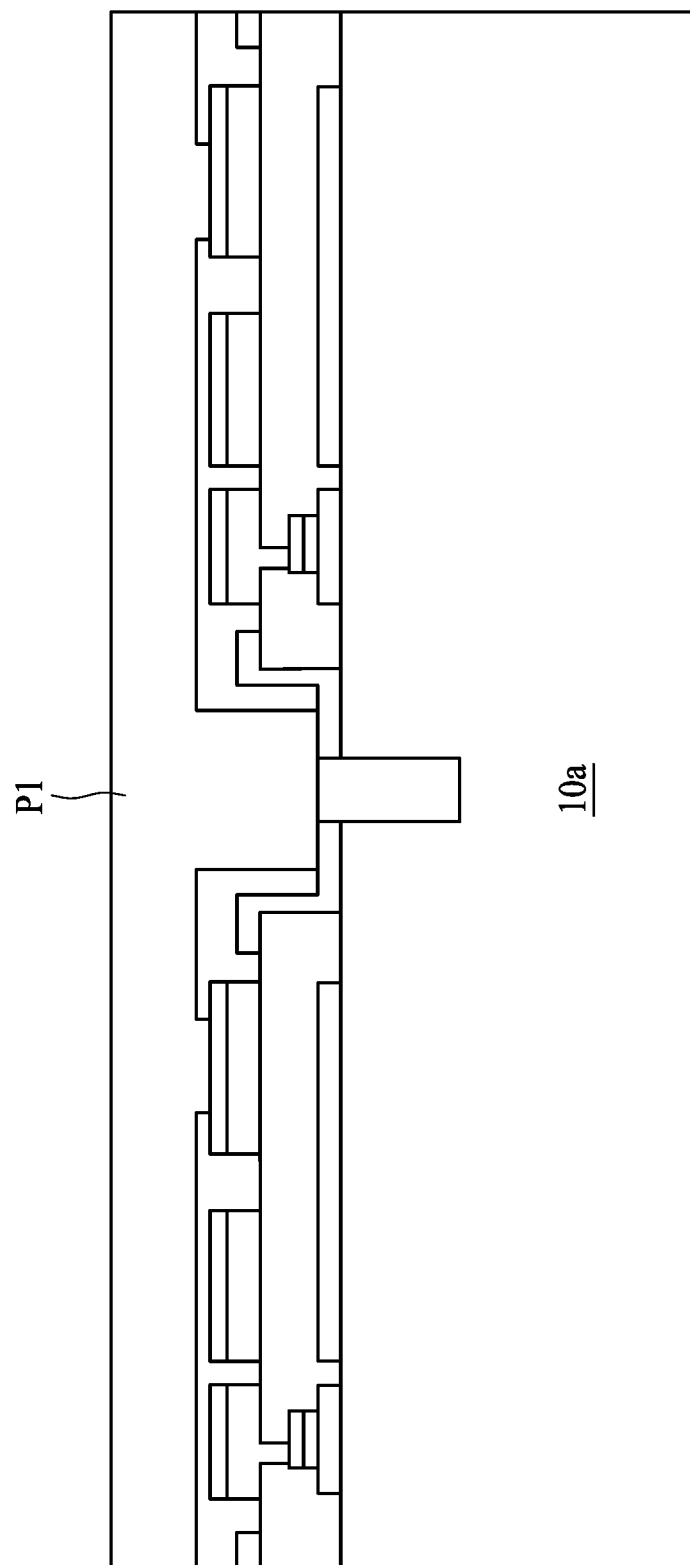
Figure 3H:
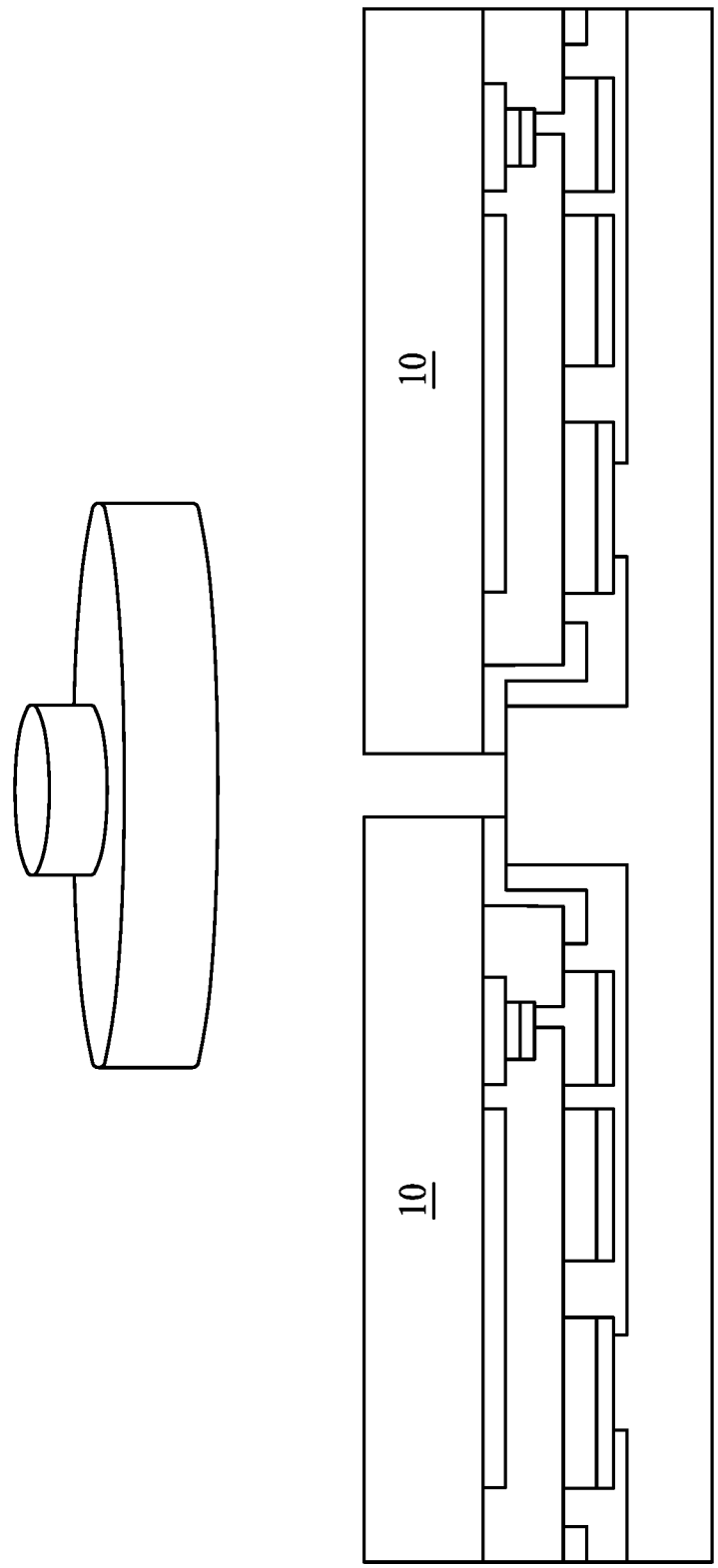

Operations shown in FIG. 3F, FIG. 3G and FIG. 3H may constitute a dicing before grinding (DBG) operation. Referring to FIG. 3F, a dicing or a half cut operation is performed along the scribe line of the transparent carrier 10*a* to form a trench 80 through the patterned conductive layer 20 and into the transparent carrier 10*a*.

Referring to FIG. 3G, a protection tape P1 is attached to the structure of FIG. 3F. The protection tape P1 may be attached by a lamination operation.

Referring to FIG. 3H, a grinding operation is performed to remove a portion of the transparent carrier 10*a*. A plurality of singulated transparent carriers 10 are formed.

Figure 3I:
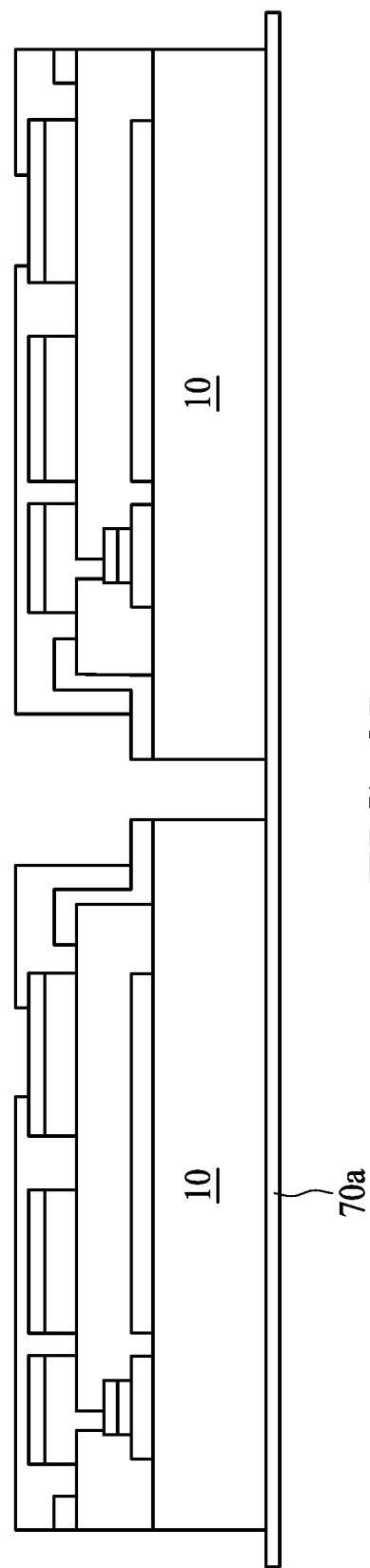

Referring to FIG. 3I, the plurality of singulated transparent carriers 10 are attached to an adhesive layer 70*a*. The protection tape P1 is removed. The adhesive layer 70*a* may include a die attach film (DAF).

Figure 3J:
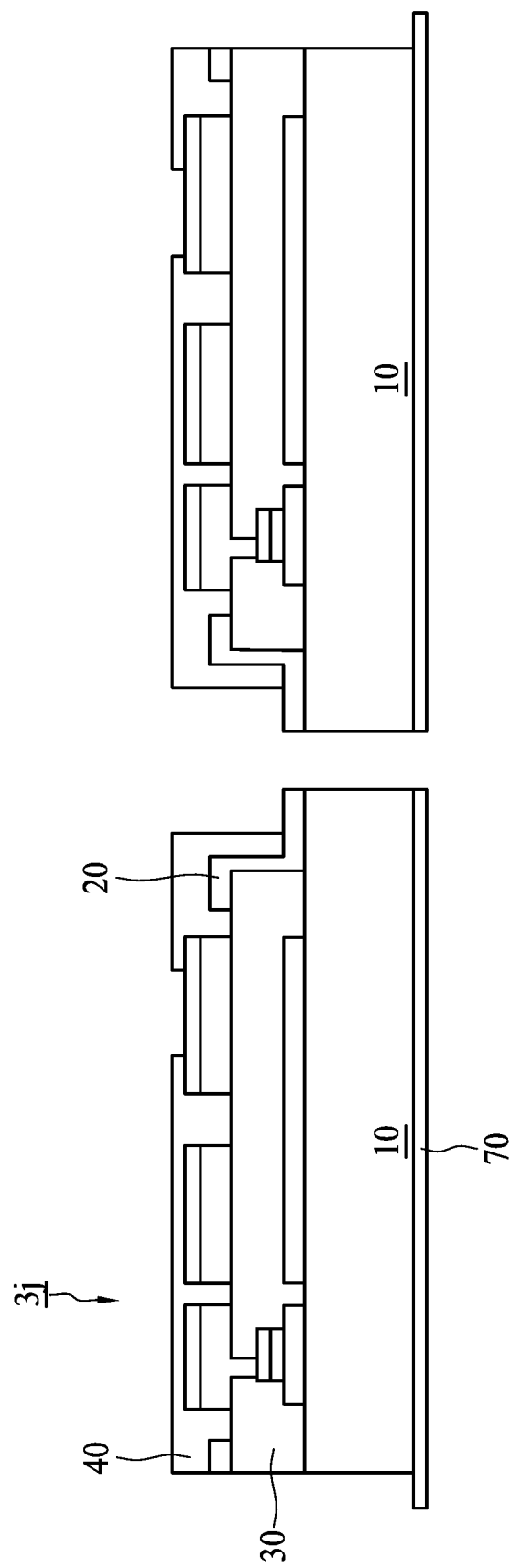

Referring to FIG. 3J, the adhesive layer 70*a* is singulated into a plurality of adhesive layers 70. The singulation operation may be performed by an optical operation, such as a laser operation. The patterned conductive layer 20 may function as an alignment mark for the singulation operation. The alignment of the laser operation may be based on the patterned conductive layer 20. A semiconductor package device 3*j* is formed. The semiconductor package device 3*j* may be similar to or the same as the semiconductor package device 1*a* in FIG. 1A. If the dicing operation in FIG. 3F is performed with a wide blade, the semiconductor package device 3*j* in FIG. 3J may be similar to or the same as the semiconductor package device 1*b* in FIG. 1B.

FIG. 4A, FIG. 4B, FIG. 4C, FIG. 4D, FIG. 4E, FIG. 4F, FIG. 4G, FIG. 4H, FIG. 4I and FIG. 4J show operations for manufacturing a semiconductor package device 4*j* in accordance with some embodiments of the subject application.

Figure 4A:
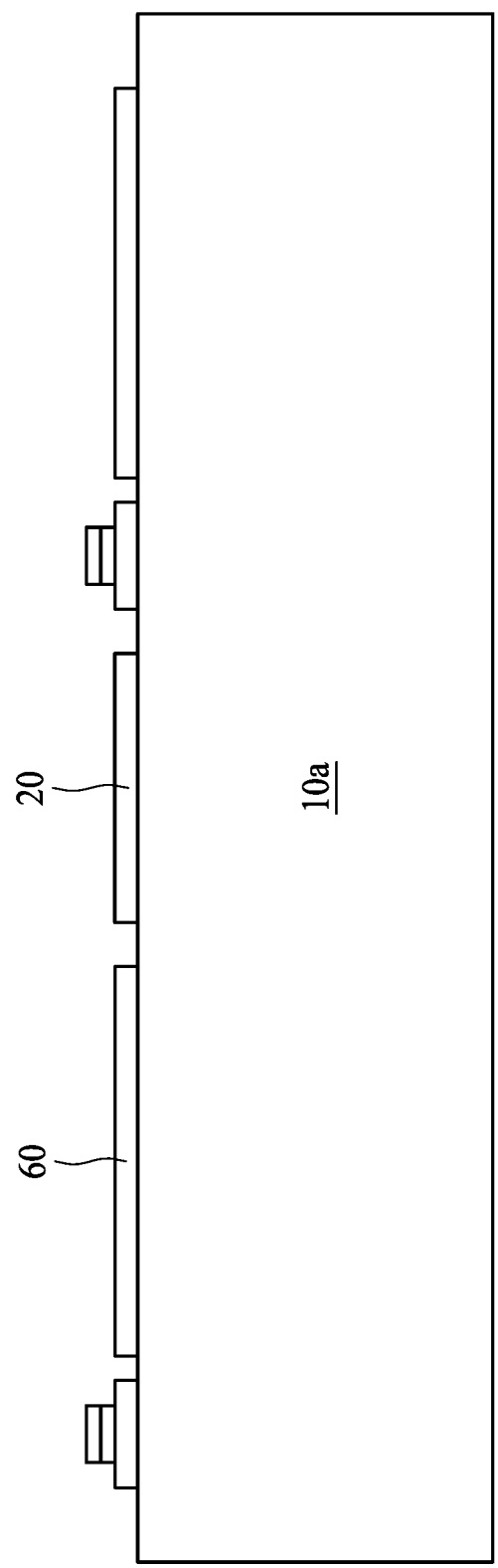
FIG. 4A, FIG. 4B, FIG. 4C, FIG. 4D, FIG. 4E, FIG. 4F, FIG. 4G, FIG. 4H, FIG. 4I and FIG. 4J show operations for manufacturing a semiconductor package device in accordance with some embodiments of the subject application.

Referring to FIG. 4A, the operations shown in FIG. 4A are similar to the operations shown in FIG. 3A except that a patterned conductive layer 20 is additionally formed on the transparent carrier 10*a*. The patterned conductive layer 20 is formed on a scribe line of the transparent carrier 10*a*. The patterned conductive layer 20 and the patterned conductive layer 60 may be formed concurrently, or may be integrally formed. The patterned conductive layer 20 and the patterned conductive layer 60 may be formed by a same operation.

Figure 4B:
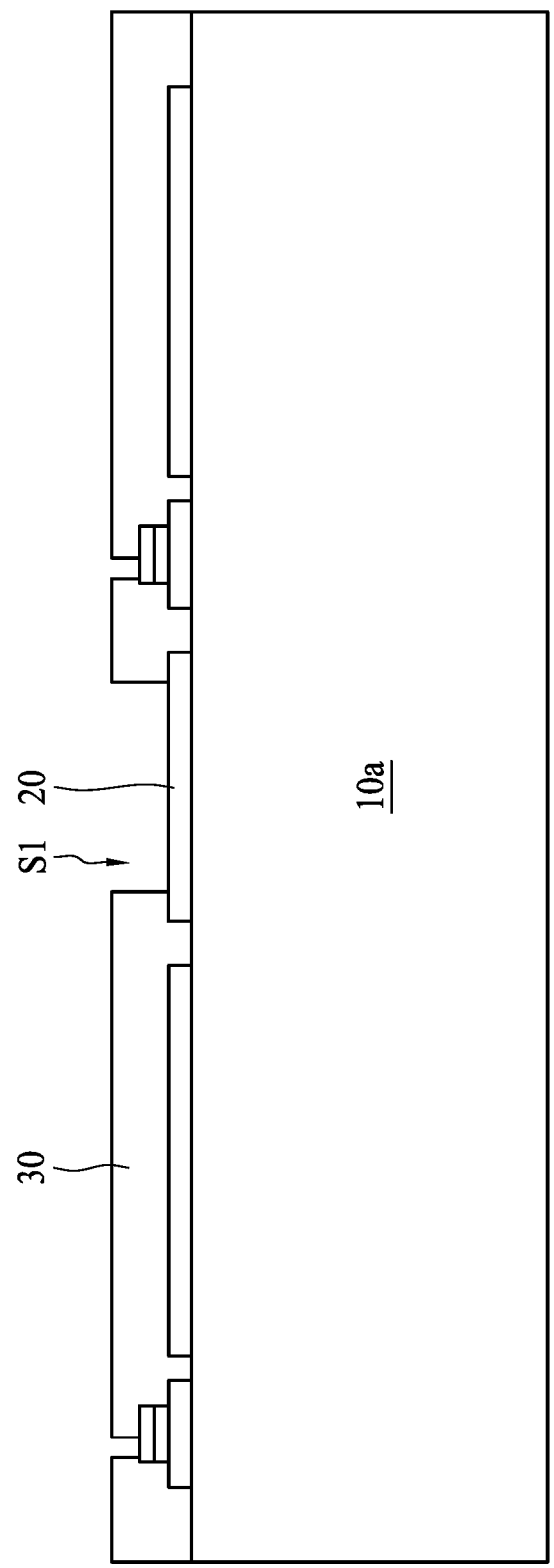

Referring to FIG. 4B, the operations shown in FIG. 4B are similar to the operations shown in FIG. 3B except that the insulation layer 30 is additionally formed on the patterned conductive layer 20, and the space S1 is formed in the insulation layer 30 to expose the patterned conductive layer 20.

Figure 4C:
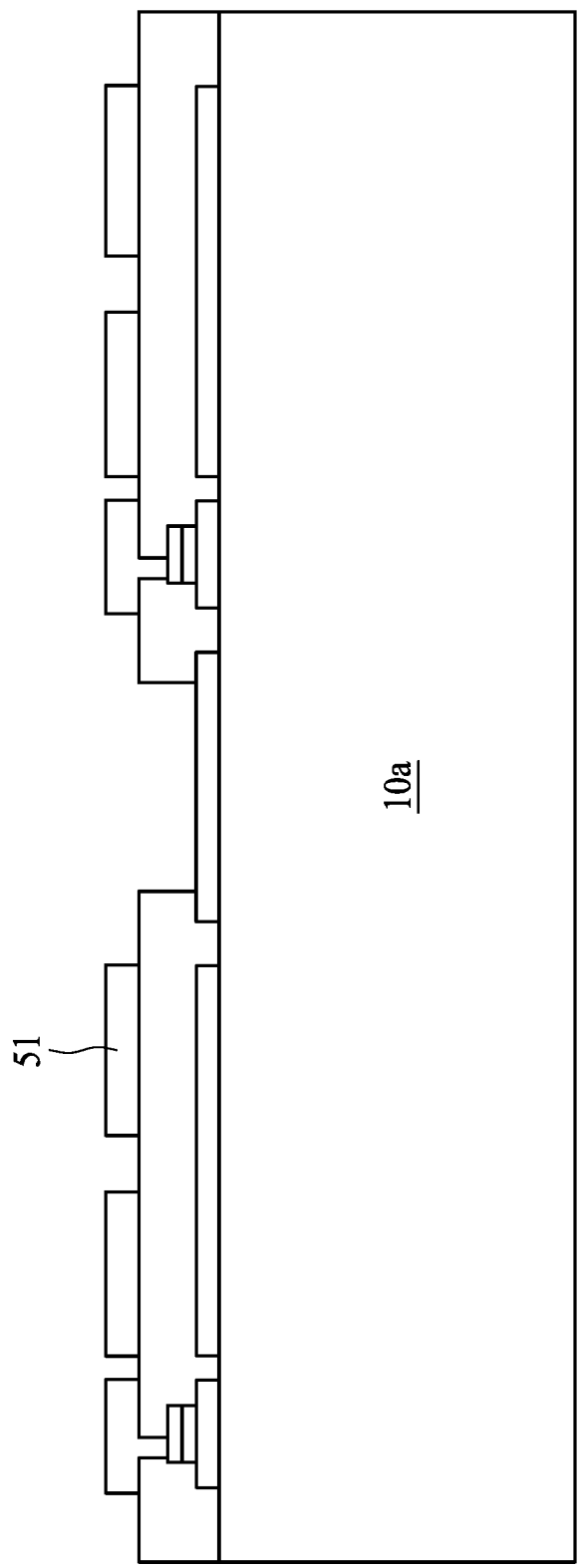

Referring to FIG. 4C, the operations shown in FIG. 4C are the same as the operations shown in FIG. 3C. A patterned conductive layer 51 is formed on the insulation layer 30.

Figure 4D:
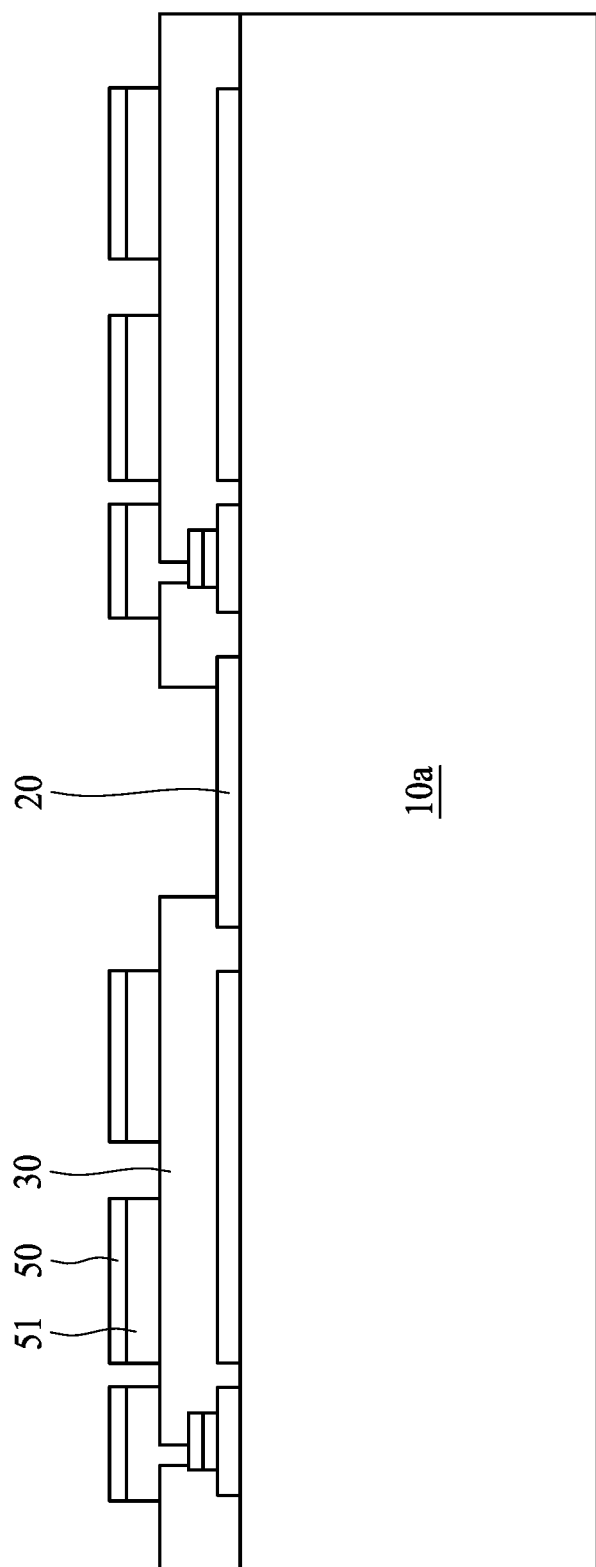

Referring to FIG. 4D, a patterned conductive layer 50 is formed on the patterned conductive layer 51. The patterned conductive layer 50 may be formed by, for example, but not limited to, a plating operation. The patterned conductive layer 50 and the patterned conductive layer 51 may form a UBM structure. The patterned conductive layers 60, 51 and 50 may be electrically isolated from the patterned conductive layer 20.

Figure 4E:
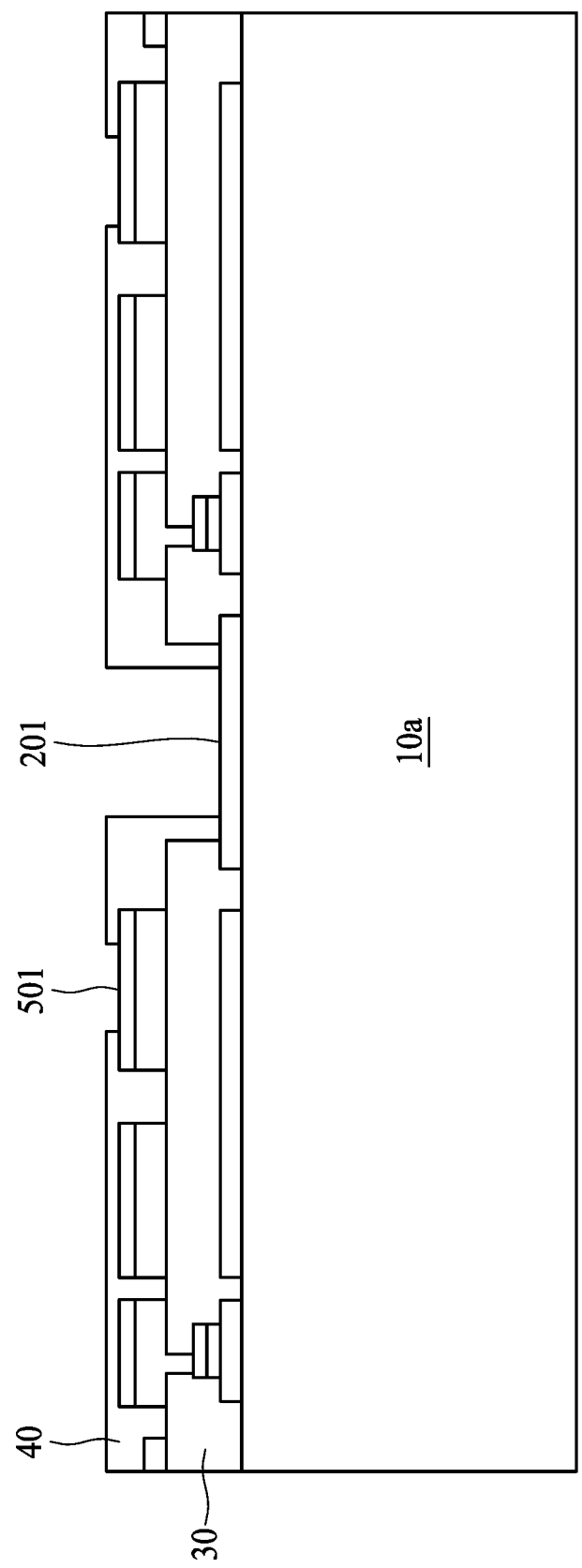

Referring to FIG. 4E, an insulation layer 40 is formed on the insulation layer 30. The insulation layer 40 covers the patterned conductive layer 20 and the patterned conductive layer 50. An etching operation is performed to expose a surface 501 of the patterned conductive layer 50 from the insulation layer 40. An etching operation is performed to expose a surface 201 of the patterned conductive layer 20 from the insulation layer 40.

Figure 4F:
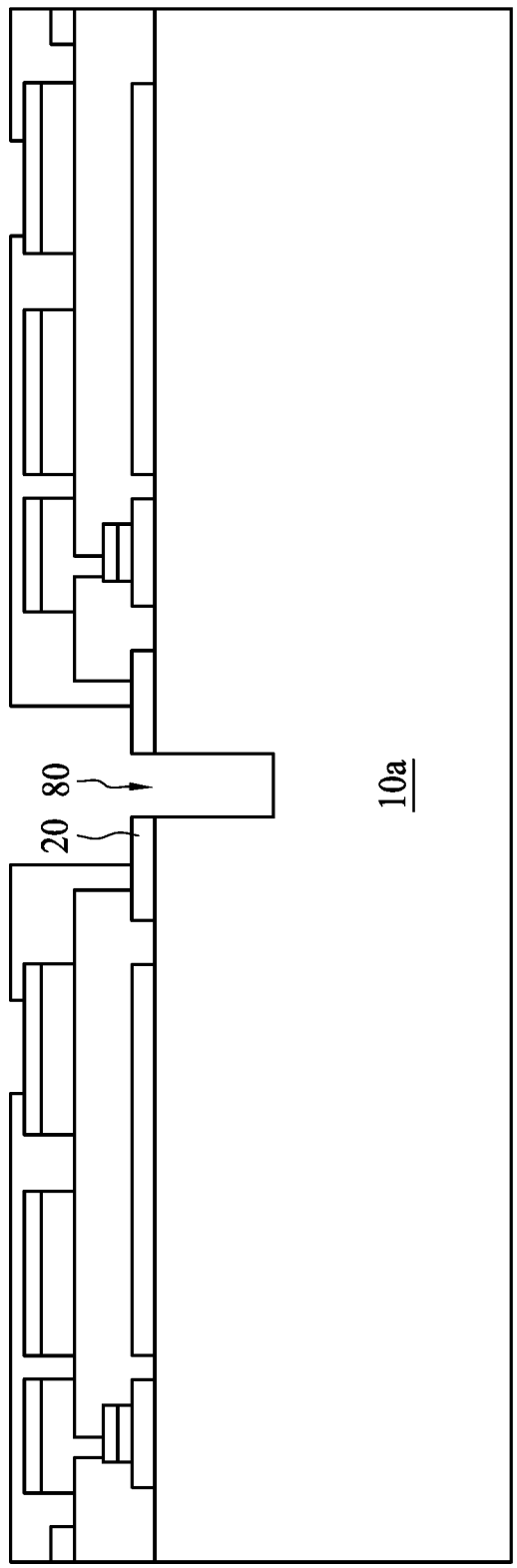
Figure 4G:
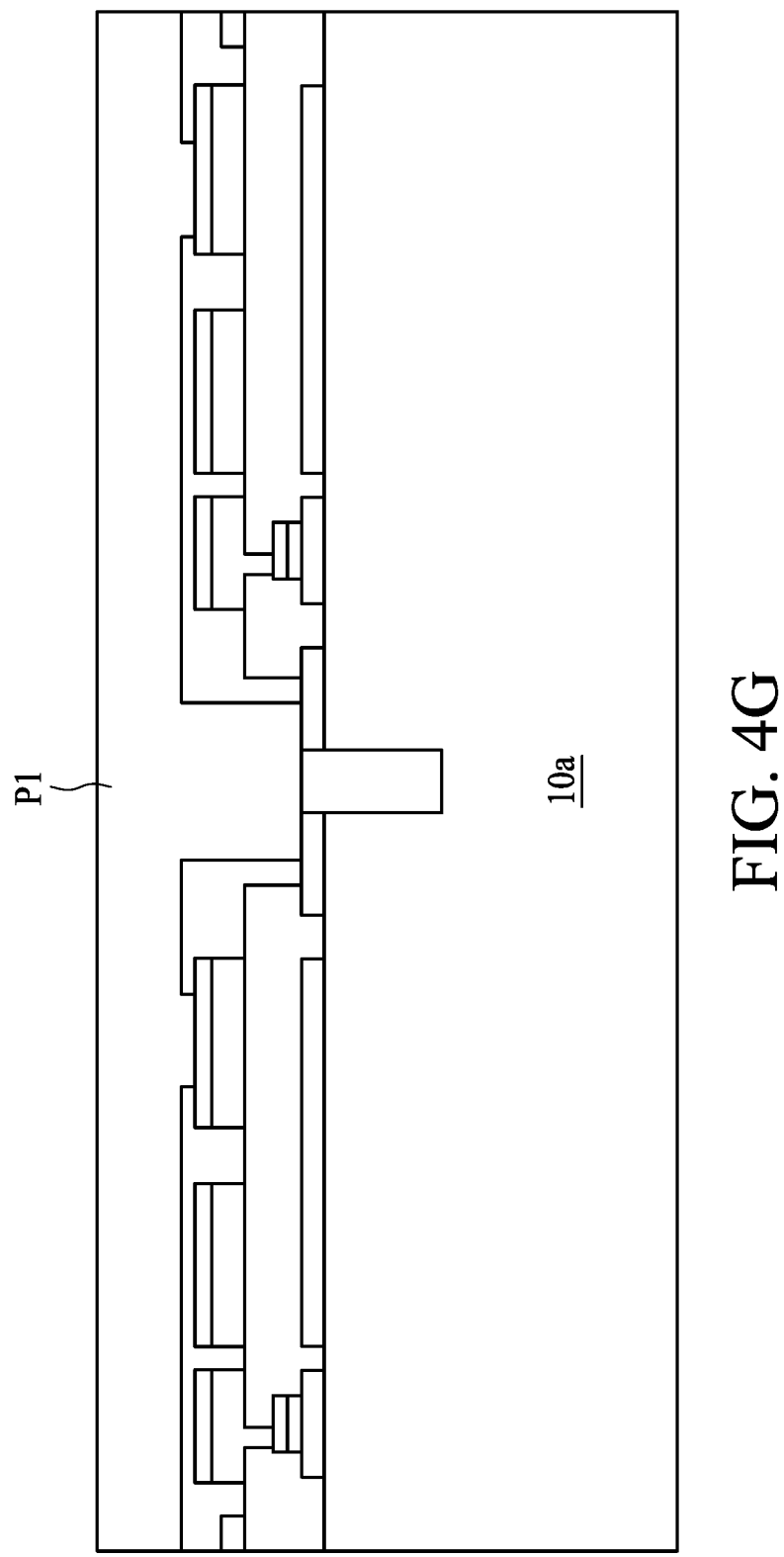
Figure 4H:
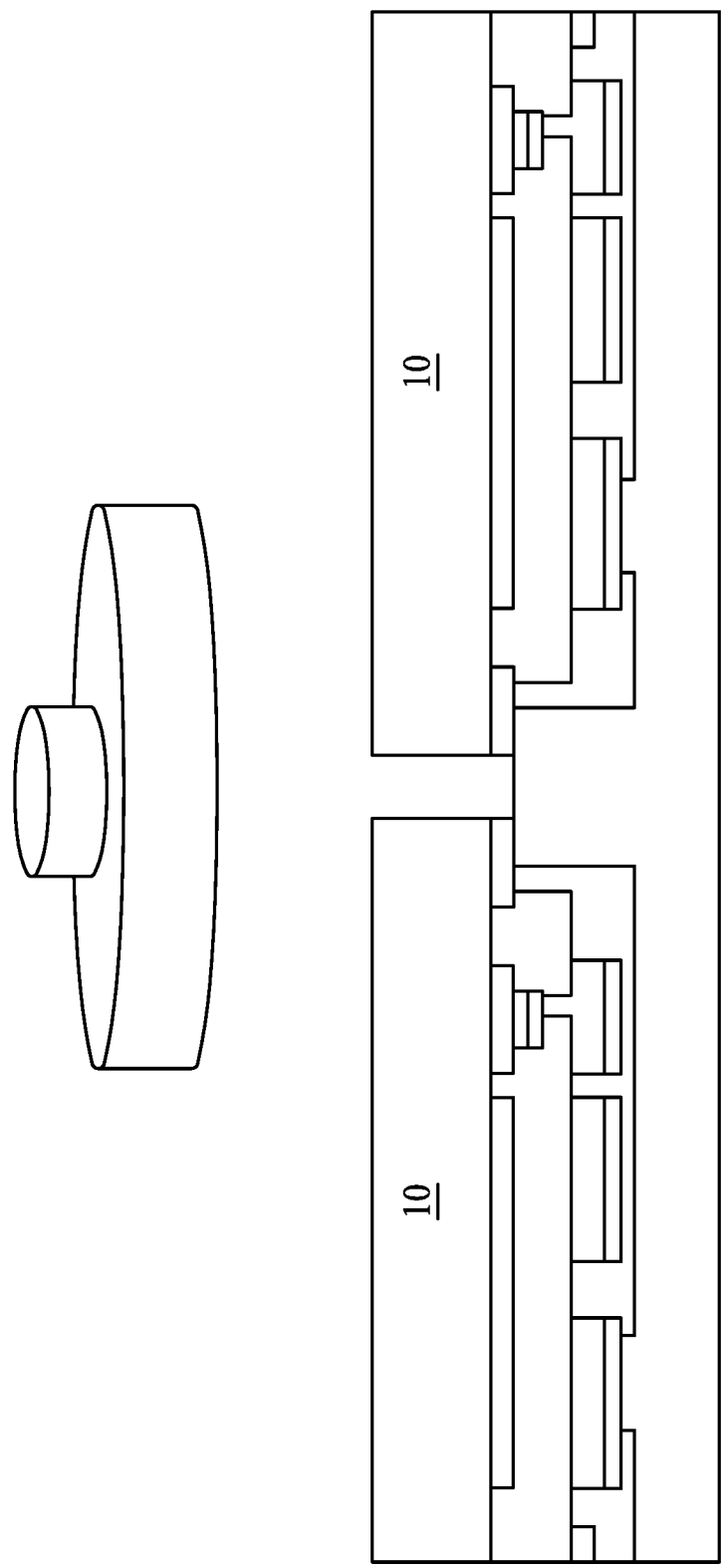

Operations shown in FIG. 4F, FIG. 4G and FIG. 4H may be referred to as a dicing before grinding (DBG) operation. Referring to FIG. 4F, a dicing or a half cut operation is performed along the scribe line of the transparent carrier 10*a* to form a trench 80 through the patterned conductive layer 20 and into the transparent carrier 10*a*.

Referring to FIG. 4G, a protection tape P1 is attached to the structure of FIG. 4F. The protection tape P1 may be attached by a lamination operation.

Referring to FIG. 4H, a grinding operation is performed to remove a portion of the transparent carrier 10*a*. A plurality of singulated transparent carriers 10 are formed.

Figure 4I:
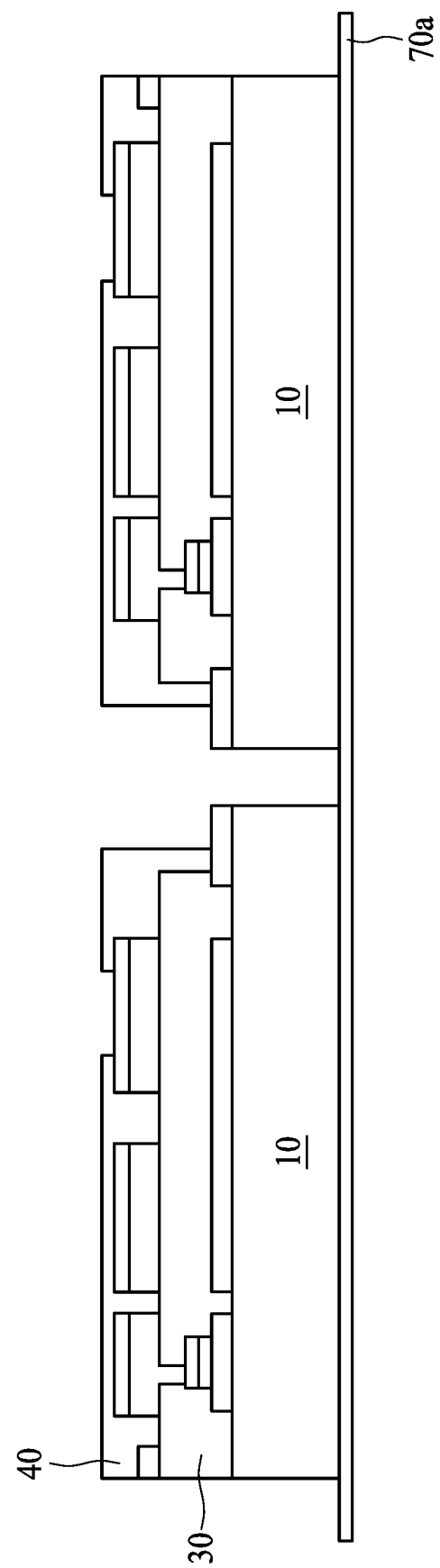

Referring to FIG. 4I, the plurality of singulated transparent carriers 10 are attached to an adhesive layer 70*a*. The protection tape P1 is removed. The adhesive layer 70*a* may include a die attach film (DAF).

Figure 4J:
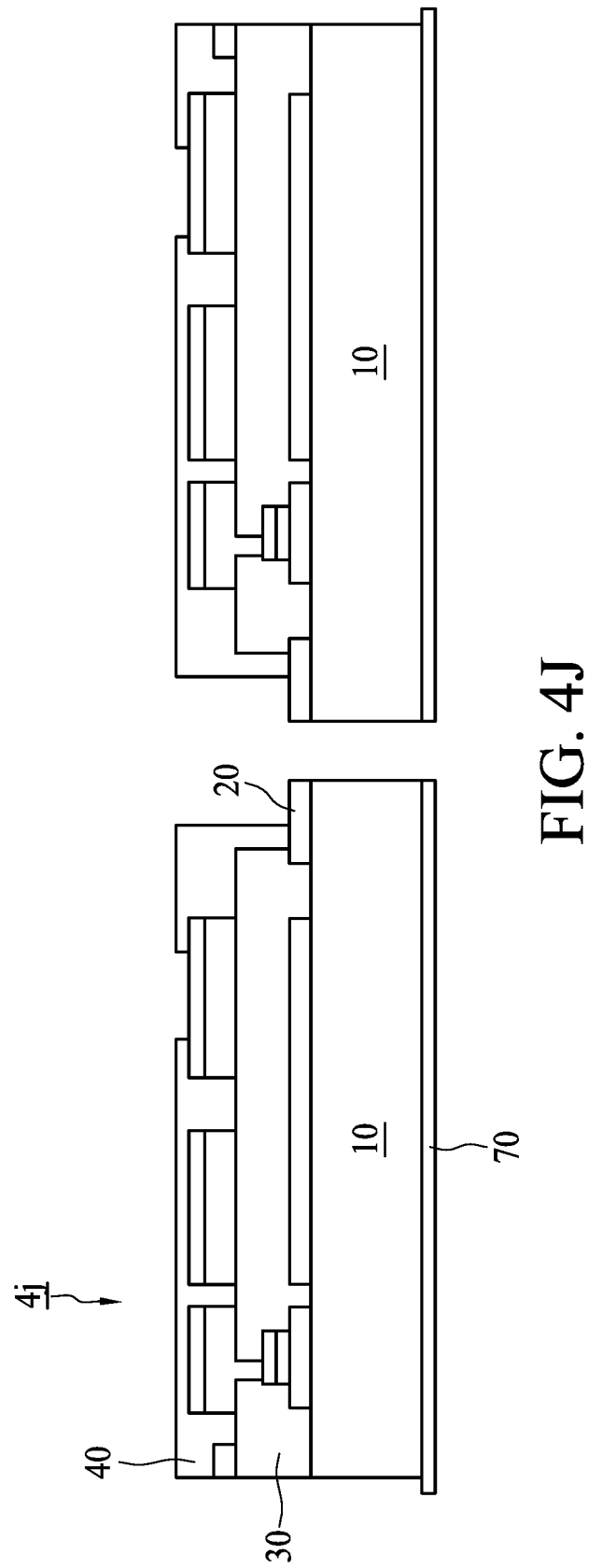

Referring to FIG. 4J, the adhesive layer 70*a* is singulated into a plurality of adhesive layers 70. The singulation operation may be performed by an optical operation, such as a laser operation. The patterned conductive layer 20 may function as an alignment mark for the singulation operation. The alignment of the laser operation may be based on the patterned conductive layer 20. A semiconductor package device 4j is formed. The semiconductor package device 4j may be similar to or the same as the semiconductor package device 2a in FIG. 2A. Note that, if the dicing operation in FIG. 4F is performed with a wide blade, the semiconductor package device 4j in FIG. 4J may be similar to or the same as the semiconductor package device 2b in FIG. 2B.

As used herein, the term "transparent" may refer to a material having a transmittance of about 50% or more, about 70% or more, or about 90% or more for a light to which the material is exposed. The term "opaque" may refer to a material having a transmittance of less than about 50%, less than about 30%, or less than about 10% for a light to which the material is exposed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be planar or substantially planar if a difference between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the subject application has been described and illustrated with reference to specific embodiments thereof, these descriptions and illustrations do not limit the subject application. It can be clearly understood by those skilled in the art that various changes may be made, and equivalent components may be substituted within the embodiments, without departing from the true spirit and scope of the subject application as defined by the appended claims. The illustrations may not necessarily be drawn to scale. There may be distinctions between the artistic renditions in the subject application and the actual apparatus, due to variables in manufacturing processes and such. There may be other embodiments of the subject application which are not specifically illustrated. The specification and drawings are to be regarded as illustrative rather than restrictive. Modifications may be made to adapt a particular situation, material, composition of matter, method, or process to the objective, spirit and scope of the subject application. All such modifications are intended to be within the scope of the claims appended hereto. While the methods disclosed herein have been described with reference to particular operations performed in a particular order, it can be understood that these operations may be combined, sub-divided or re-ordered to form an equivalent method without departing from the teachings of the subject application. Therefore, unless specifically indicated herein, the order and grouping of the operations are not limitations of the subject application.

What is claimed is:

1. A semiconductor package device, comprising:
   a light-transmissible carrier having a first surface and a second surface opposite to the first surface;
   a patterned layer disposed on the first surface of the light-transmissible carrier; and
   an adhesive layer disposed on the second surface of the light-transmissible carrier
   wherein the patterned layer is configured to function as an alignment mark to define a side surface of the adhesive layer.

2. The semiconductor package device of claim 1, wherein the side surface of the adhesive layer is substantially aligned with a side surface of the light-transmissible carrier, and the side surface of the adhesive layer is further substantially aligned with a side surface of the patterned layer.

3. The semiconductor package device of claim 2, further comprising a light-transmissible insulation layer disposed on the first surface of the light-transmissible carrier and covering an upper surface of the patterned layer.

4. The semiconductor package device of claim 3, wherein the light-transmissible insulation layer has a side surface substantially aligned with the side surface of the patterned layer.

5. The semiconductor package device of claim 1, further comprising a patterned conductive layer disposed on the first surface of the light-transmissible carrier, wherein a bottom surface of the patterned conductive layer is substantially leveled with the first surface of the light-transmissible carrier, and the patterned conductive layer is spaced apart from the patterned layer.

6. The semiconductor package device of claim 5, wherein the bottom surface of the patterned conductive layer is substantially leveled with a bottom surface of the patterned layer.

7. The semiconductor package device of claim 5, wherein the patterned layer is electrically isolated from the patterned conductive layer.

8. The semiconductor package device of claim 5, wherein the patterned conductive layer and the patterned layer are formed concurrently.

9. The semiconductor package device of claim 5, further comprising an integrated passive device (IPD), wherein the patterned conductive layer is a part of the IPD.

10. The semiconductor package device of claim 9, further comprising:

an insulation layer disposed on the patterned conductive layer; and a metal layer disposed on the insulation layer, wherein the patterned conductive layer, the insulation layer, and the metal layer constitute a stacked structure.

11. The semiconductor package device of claim 5, further comprising a light-transmissible insulation layer covering the patterned conductive layer and an upper surface of the patterned layer, wherein a bottom surface of the light-transmissible insulation layer is substantially leveled with the first surface of the light-transmissible carrier.

12. The semiconductor package device of claim 11, further comprising:

an insulation layer on the patterned conductive layer; and a metal layer on the insulation layer, wherein the patterned conductive layer, the insulation layer, and the metal layer constitute a stacked structure, and the light-transmissible insulation layer covers the insulation layer and the metal layer and exposes a portion of an upper surface of the metal layer.

13. The semiconductor package device of claim 1, further comprising:

a first light-transmissible insulation layer on the first surface of the light-transmissible carrier; and a second light-transmissible insulation layer on the first surface of the light-transmissible carrier, wherein an upper surface of the patterned layer comprises a first portion and a second portion, the first portion is covered by the first light-transmissible insulation layer, and the second portion is covered by the second light-transmissible insulation layer.

14. The semiconductor package device of claim 13, wherein the upper surface of the patterned layer further comprises a third portion exposed from the first light-transmissible insulation layer and the second light-transmissible insulation layer.

15. The semiconductor package device of claim 1, wherein a portion of an upper surface of the adhesive layer is exposed from the light-transmissible carrier.

16. A semiconductor package device, comprising:

a light-transmissible carrier having a first surface and a second surface opposite to the first surface;

a patterned layer disposed on the first surface of the light-transmissible carrier; and an adhesive layer disposed on the second surface of the light-transmissible carrier, wherein a side surface of the adhesive layer is substantially aligned with a side surface of the patterned layer, wherein the adhesive layer is configured to attach the semiconductor package device to an external device or circuit board, and wherein the adhesive layer comprises a light-transmissible material.

17. A semiconductor package device, comprising:

a light-transmissible carrier having a first surface and a second surface opposite to the first surface;

a patterned layer disposed on the first surface of the light-transmissible carrier; and an adhesive layer disposed on the second surface of the light-transmissible carrier, wherein a side surface of the adhesive layer is substantially aligned with a side surface of the patterned layer, wherein the adhesive layer is configured to attach the semiconductor package device to an external device or circuit board;

a first light-transmissible insulation layer on the first surface of the light-transmissible carrier; and a second light-transmissible insulation layer on the first surface of the light-transmissible carrier, wherein an upper surface of the patterned layer comprises a first portion and a second portion, the first portion is covered by the first light-transmissible insulation layer, and the second portion is covered by the second light-transmissible insulation layer.

18. The semiconductor package device of claim 17, further comprising:

a stacked structure comprising a patterned conductive layer, an insulation layer, and a metal layer, wherein the light-transmissible insulation layer covers the stacked structure and exposes a portion of an upper surface of the metal layer.

19. The semiconductor package device of claim 17, wherein the upper surface of the patterned layer further comprises a third portion exposed from the first light-transmissible insulation layer and the second light-transmissible insulation layer.

* * * * *